(12) United States Patent
Miluzzi (10) Patent No.: US 9,560,455 B2
(45) Date of Patent: Jan. 31, 2017

(54) OFFSET CALIBRATION IN A MULTIPLE MEMBRANE MICROPHONE

(71) Applicant: STMICROELECTRONICS S.R.L., Agrate Brianza (IT)

(72) Inventor: Eugenio Miluzzi, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/752,475

(22) Filed: Jun. 26, 2015

(65) Prior Publication Data

US 2016/0381465 A1 Dec. 29, 2016

(51) Int. Cl.
*H04R 29/00* (2006.01)
*H04R 19/04* (2006.01)
*H04R 3/00* (2006.01)
*H03F 3/183* (2006.01)

(52) U.S. Cl.
CPC .............. *H04R 19/04* (2013.01); *H03F 3/183* (2013.01); *H04R 3/005* (2013.01); *H04R 29/005* (2013.01); *H03F 2200/03* (2013.01)

(58) Field of Classification Search
CPC ....... H04R 19/04; H04R 3/005; H04R 19/005; H03F 3/183; H03F 2200/03
See application file for complete search history.

(56) References Cited

U.S. PATENT DOCUMENTS

| | | | | |
|---|---|---|---|---|
| 4,479,265 A * | 10/1984 | Muscatell | ............. | H04R 27/00 359/285 |
| 4,495,470 A * | 1/1985 | Bristol | .................... | H03F 1/304 330/51 |
| 4,766,312 A * | 8/1988 | Fergusson | ............. | H01J 49/025 250/281 |
| 5,410,604 A * | 4/1995 | Saito | .................. | G10K 11/1786 381/71.12 |
| 5,640,460 A * | 6/1997 | May | ....................... | H03G 3/001 381/104 |
| 5,848,146 A * | 12/1998 | Slattery | ................. | H04M 9/082 379/388.01 |
| 2007/0222504 A1* | 9/2007 | Bates | ...................... | H03F 1/305 330/9 |
| 2007/0280341 A1* | 12/2007 | Hidaka | .................. | G01D 21/00 375/229 |

(Continued)

OTHER PUBLICATIONS

Miluzzi, E., et al., "Processing Circuit for a Multiple Sensing Structure Digital Microelectromechanical Sensor Having a Broad Dynamic Range and Sensor Comprising the Processing Circuit," U.S. Appl. No. 14/626,636, filed Feb. 19, 2015 (45 pgs.).

*Primary Examiner* — Simon Sing
(74) *Attorney, Agent, or Firm* — Seed IP Law Group LLP (57) ABSTRACT

A multi-membrane microphone including an audio processing circuit is disclosed. The membranes are configured to output to a plurality of amplifiers a plurality of sensing signals in response to sound. The amplifiers in turn create amplified signals by amplifying the sensing signals and introduce a plurality of offsets into the amplified signals, respectively. The audio processing circuit includes a controller that sequentially measures the offset for each amplifier a corresponding membrane is inactive and stores the offset. The controller also compensates each amplified signal by the corresponding offset during operation of the multi-membrane microphone.

20 Claims, 6 Drawing Sheets

(56) References Cited

U.S. PATENT DOCUMENTS

| | | | |
|---|---|---|---|
| 2009/0232338 A1* | 9/2009 | Song | H04R 1/24 |
| | | | 381/312 |
| 2011/0123049 A1* | 5/2011 | Crespi | H03F 1/301 |
| | | | 381/121 |
| 2011/0255228 A1* | 10/2011 | Kimura | G01D 5/24 |
| | | | 361/679.01 |
| 2013/0031950 A1 | 2/2013 | Donadel et al. | |
| 2014/0191343 A1 | 7/2014 | Kasai et al. | |
| 2015/0358743 A1* | 12/2015 | Killion | H04L 27/04 |
| | | | 381/323 |

\* cited by examiner

OFFSET CALIBRATION IN A MULTIPLE MEMBRANE MICROPHONE

BACKGROUND

Technical Field

The present disclosure relates to calibrating offsets in multiple membrane microphones and, in particular, offsets introduced in audio signals by channel amplifiers.

Description of the Related Art

Acoustic transducers, such as a microphone of a microelectromechanical system (MEMS), typically comprise a sensing structure for transducing acoustic pressure waves into an electrical signal (for example, by capacitive variation). The acoustic transducers may further comprise electronic circuitry for processing the electrical signals and supplying an output signal that may be analog or digital as in the case of a digital microphone. The output signal may be modulated in accordance with any type of modulation scheme such as a pulse-density modulation (PDM) modulation scheme. The output signal may then be made available to an external electronic system, such as for example a microcontroller of an electronic apparatus that incorporates the MEMS microphone.

Figure 1:
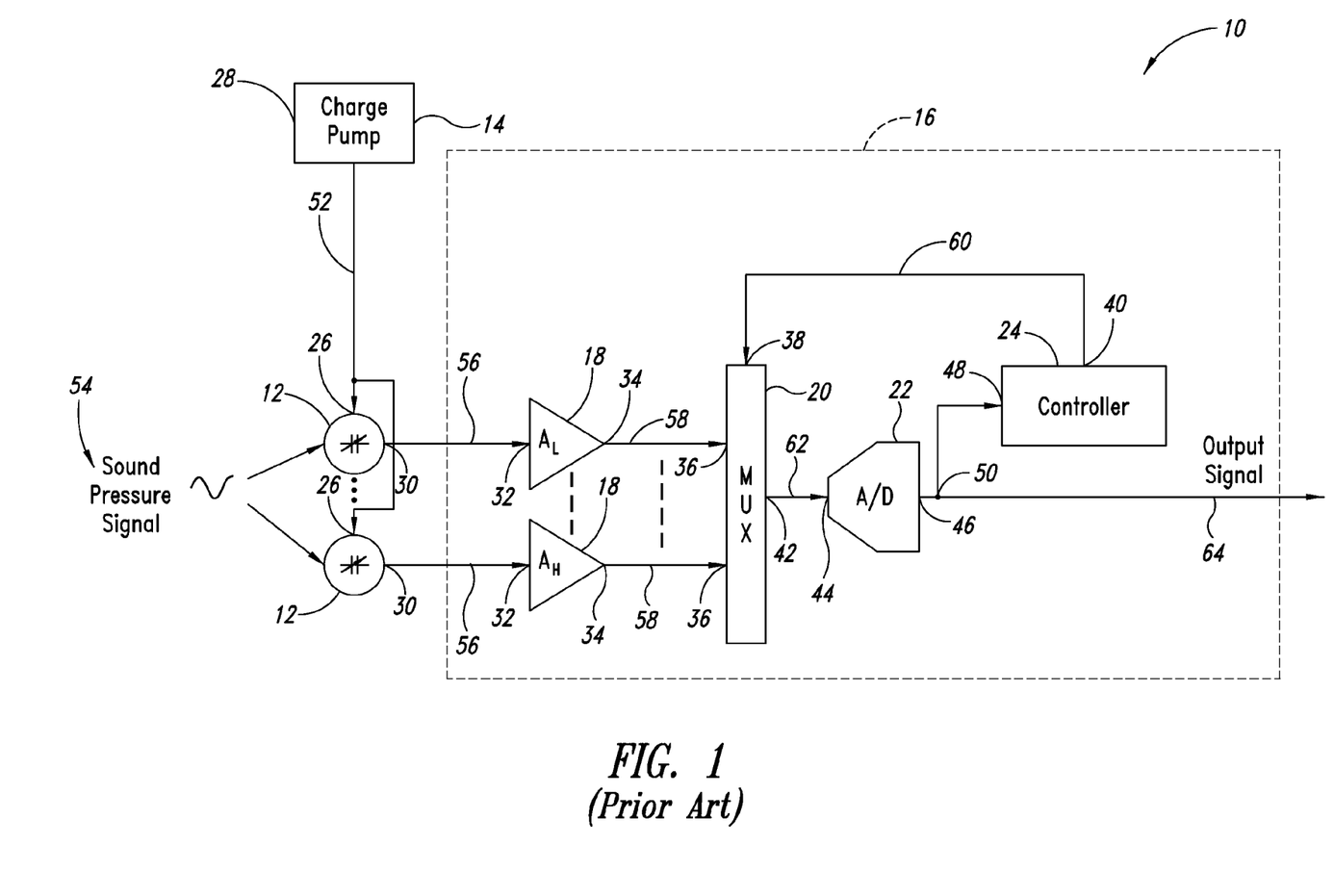
FIG. 1 shows a schematic of a multi-membrane microphone.

FIG. 1 shows a schematic of a multi-membrane microphone 10. The multi-membrane microphone 10 (also referred to herein as a multiple membrane microphone) comprises a plurality of membranes 12, a charge pump 14, and an audio processing circuit 16. The audio processing circuit 16 comprises a plurality of amplifiers 18, a multiplexer 20, an analog-to-digital (A/D) converter 22 and a controller 24.

An input port 26 of each membrane 12 is electrically coupled to an output port 28 of the charge pump 14. Further, an output port 30 of each membrane 12 is electrically coupled to an input port 32 of a respective amplifier 18 of the plurality of amplifiers 18. An output port 34 of each amplifier 18 of the plurality of amplifiers 18 is electrically coupled to a respective input port 36 of a plurality of input ports 36 of the multiplexer 20. Further, a selection signal input port 38 of the multiplexer 20 is electrically coupled to a selection signal output port 40 of the controller 24.

As shown in FIG. 1, an output port 42 of the multiplexer 20 is electrically coupled to an input port 44 of the A/D converter 22, and an output port 46 of the A/D converter 22 is electrically coupled to an input port 48 of the controller 24 at output node 50. An output signal of the audio processing circuit 16 may be sensed at the output node 50.

The input port 26 of each membrane 12 receives a charging signal 52 from the output port 28 of the charge pump 14, whereby the charging signal 52 is used to maintain a constant charge on the sensing capacitor of the membrane 12. The constant charge is maintained to enable the membrane 12 to better transduce an impinging sound pressure signal 54. As a result of the sound pressure signal 54 impinging on the membrane 12, the membrane 12 produces a respective sensing signal 56 at its output port 30.

The membranes 12 may have different sensitivities and may have different signal-to-noise ratio (SNR) ratings. The controller 24 of the audio processing circuit 16 may switch between membranes 12 depending on a level of the sound pressure signal 54. For example, one membrane 12 may have greater sensitivity than another membrane 12 and may be used when the sound pressure signal 54 impinging on the membranes 12 is below a threshold, whereas the other membrane having the lower sensitivity may be utilized when the sound pressure signal 54 is greater than the threshold. Switching between audio detection by the plurality of membranes 12 improves the audio detection capability of the microphone 10.

The plurality of amplifiers 20 receive a respective sensing signal 56 at their respective input ports 32. Each amplifier 20 of the plurality of amplifiers 20 amplifies a signal level of the respective sensing signal 56 and outputs an amplified signal 58 at the respective output port 34 of the amplifier 18. The multiplexer 24 receives the plurality of amplified signals 58 at the respective plurality of input ports 36. The multiplexer 20 also receives a selection signal 60 from the controller 24 at its selection signal port 38. The selection signal 60 indicates selection of one of the plurality of amplified signals 58 for processing. Based on the selection signal 60, the multiplexer 20 outputs, at its output port 42, one of the amplified signals 58 as a selected amplified signal 62.

The selection signal 60 indicates an audio channel selected for processing by the controller 24, whereby the audio channel comprises the membrane 12 and amplifier 18 corresponding to the selected amplified signal 62. The A/D converter 22 receives the selected amplified signal 62 at its input port 44 and converts the selected amplified signal 62 from analog format to digital format. The A/D converter 22 outputs, at its output port 46, an output signal 64 that is the result of the conversion.

The output signal 64 is received by the controller 24 at its input port 48. The controller 24 uses feedback control to control audio channel selection. For example, based at least in part on a signal power level or noise power level of the output signal 64, the controller may determine to switch between audio channels. For example, if the signal power level of the sound pressure signal 54 falls below a threshold, the controller 24 may select the membrane 12 having a higher sensitivity for detecting the sound pressure signal 54. Conversely, the controller 24 may select the membrane 12 having a lower sensitivity for detecting the sound pressure signal 54. The controller 24 selects the membrane 12 for detecting the sound pressure signal 54 by outputting the selection signal 60 indicating the selection of the amplified sensing signal 58 corresponding to the membrane 12.

BRIEF SUMMARY

A multi-membrane microphone may be summarized as including a plurality of membranes configured to be activated when the multi-membrane microphone is in operation, the plurality of membranes being configured to output a plurality of sensing signals, respectively, in response to sound; a plurality of amplifiers respectively having a plurality of input ports respectively electrically coupled to the plurality of membranes, the plurality of amplifiers respectively corresponding to the plurality of sensing signals, each amplifier of the plurality of amplifiers being configured to receive the corresponding sensing signal and create a corresponding amplified signal of a plurality of amplified signals by amplifying the corresponding sensing signal, the plurality of amplifiers being configured to introduce a plurality of offsets into the amplified signals, respectively; a multiplexer configured to receive the plurality of amplified signals and a selection signal indicating selection of a selected amplified signal of the plurality of amplified signals and output the selected amplified signal in response to receiving the selection signal; and a controller electrically coupled to the multiplexer and configured to: sequentially measure the offset for each amplifier of the plurality of amplifiers while the membrane is inactive and store the offset; and compensate each amplified signal by the corresponding offset during operation of the multi-membrane microphone.

The multi-membrane microphone may further include a charge pump electrically coupled to the plurality of membranes and the controller and configured to receive an activation command from the controller and activate or deactivate the plurality of membranes based on the activation command. The amplifiers may be configured to introduce the respective offsets into the respective amplified signals by respectively additively combining the respective offsets into the respective amplified signals.

The controller may be further configured to detect that the multi-membrane microphone is turned on or existed sleep mode and, in response to the detecting, sequentially measure the offset for each amplifier.

The multi-membrane microphone may further include a plurality of registers electrically coupled to the controller, the plurality of registers being configured to receive the plurality of offsets from the controller and respectively store the offsets.

The multi-membrane microphone may further include an analog-to-digital (A/D) converter electrically coupled to the multiplexer and the controller, the A/D converter being configured to receive the selected amplified signal from the multiplexer, convert the selected amplified signal from an analog signal to a digital signal and output the selected amplified signal as the digital signal to the controller.

The multi-membrane microphone may further include an offset selection multiplexer electrically coupled to the controller and the plurality of registers, the offset selection multiplexer configured to receive an offset selection signal from the controller indicating a selected offset of the plurality of offsets and output a corresponding selected offset stored in a respective register; and an adder electrically coupled to the offset selection multiplexer and the A/D converter, the adder being configured to receive the selected offset from the offset selection multiplexer and the selected amplified signal from the A/D converter, reduce a signal level of the selected amplified signal by the selected offset to generate an output signal, and output the output signal. The controller may be configured to compensate each amplified signal by outputting the offset selection signal to the offset selection multiplexer.

The multi-membrane microphone may further include a grounding switch having a cathode electrically coupled to ground, a plurality of anodes respectively electrically coupled to the plurality of input ports of the plurality of amplifiers and a switching port electrically coupled to the controller, wherein the grounding switch is configured to receive, at the switching port, a signal from the controller indicating that the grounding switch is to be closed or opened, and the grounding switch is configured to be placed in a closed position or an opened position in response to the signal. The controller may be configured to deactivate the plurality of membranes by outputting the signal indicating that the grounding switch is to be closed.

A method may be summarized as including obtaining a plurality of offsets corresponding to a plurality of channels, respectively, of a microphone, the obtaining including, for each channel: detecting a signal level on the channel while audio input to the channel is not enabled; and determining the offset of the channel based on the detected signal level on the channel while the channel is not enabled; storing the plurality of offsets; enabling audio input to a selected channel of the channels; and processing the audio input by adjusting the audio input by the corresponding offset stored for the channel.

Determining the offset of the channel may further include determining the offset as a DC value representing the detected signal level on the channel while the channel is not enabled.

The method may further include disabling the channel prior to determining the offset of the channel.

The method may further include converting the audio input from analog to digital prior to processing the audio input.

An audio processing circuit for a multi-channel microphone may be summarized as including a plurality of amplifiers configured to respectively receive a plurality of sensing signals and create a corresponding plurality of amplified signals by amplifying the respective plurality of sensing signals, the plurality of amplifiers being configured to introduce a plurality of offsets into the amplified signals, respectively; a multiplexer configured to receive the plurality of amplified signals and a selection signal indicating selection of a selected amplified signal of the plurality of amplified signals and output the selected amplified signal in response to receiving the selection signal; and a controller electrically coupled to the multiplexer and configured to: sequentially measure the offset for each amplifier of the plurality of amplifiers while the membrane is inactive and store the offset; and compensate each amplified signal by the corresponding offset during operation of the multi-membrane microphone.

The audio processing circuit may further include a plurality of membranes electrically coupled to the plurality of amplifiers, respectively, and configured to be individually activated when the multi-membrane microphone is in operation.

The audio processing circuit may further include a charge pump electrically coupled to the plurality of membranes and the controller and configured to receive an activation command from the controller and activate or deactivate the plurality of membranes based on the activation command.

The audio processing circuit may further include a plurality of registers configured to store a respective plurality of offsets of the plurality of amplifiers; an offset selection multiplexer electrically coupled to the controller and the plurality of registers, the offset selection multiplexer configured to receive an offset selection signal from the controller indicating a selected offset of the plurality of offsets and output a corresponding selected offset stored in a respective register; and an analog-to-digital (A/D) converter electrically coupled to the multiplexer and the controller, the A/D converter being configured to receive the selected amplified signal from the multiplexer, convert the selected amplified signal from an analog signal to a digital signal and output the selected amplified signal as the digital signal to the controller; and an adder electrically coupled to the offset selection multiplexer and the A/D converter, the adder being configured to receive the selected offset from the offset selection multiplexer and the selected amplified signal from the A/D converter, reduce a signal level of the selected amplified signal by the selected offset to generate an output signal, and output the output signal.

A system may be summarized as including a microprocessor; a multi-membrane microphone electrically coupled to the microprocessor, the multi-membrane microphone comprising: a plurality of membranes configured to be activated when the multi-membrane microphone is in operation, the plurality of membranes being configured to output a plurality of sensing signals, respectively, in response to sound; and an audio processing circuit comprising: a plurality of amplifiers respectively electrically coupled to the plurality of membranes and respectively corresponding to the plurality of sensing signals, each amplifier of the plurality of amplifiers being configured to receive the corresponding sensing signal and create a corresponding amplified signal of a plurality of amplified signals by amplifying the corresponding sensing signal, the plurality of amplifiers being configured to introduce a plurality of offsets into the amplified signals, respectively; a multiplexer configured to receive the plurality of amplified signals and a selection signal indicating selection of a selected amplified signal of the plurality of amplified signals and output the selected amplified signal in response to receiving the selection signal; and a controller electrically coupled to the multiplexer and configured to: sequentially measure the offset for each amplifier of the plurality of amplifiers while the membrane is inactive and store the offset; and compensate each amplified signal by the corresponding offset during operation of the multi-membrane microphone.

The controller may be further configured to detect that the multi-membrane microphone was turned on or existed sleep mode and, in response to the detecting, sequentially measure the offset for each amplifier.

DETAILED DESCRIPTION

During the course of operation of the microphone 10, the plurality of amplifiers 18 may each introduce a respective offset in the respective amplified sensing signal 58. The offset may be a DC value and may be additively combined into the amplified sensing signal 58. Further, the offset of one amplifier 18 may be different than that of another amplifier 18. However, the offset of one amplifier 18 may be largely constant over time and under similar environmental conditions.

The presence of the offsets results in a "snap" effect when switching between audio channels and the "snap" may be audible to a human ear hearing the output signal 64 (for example, as acoustically rendered by a speaker).

It is desirable to mitigate the audible snap resulting from amplifier offsets in the multi-membrane microphone 10. Furthermore, it is desirable to mitigate the offset by calibrating the multi-membrane microphone 10.

Figure 2:
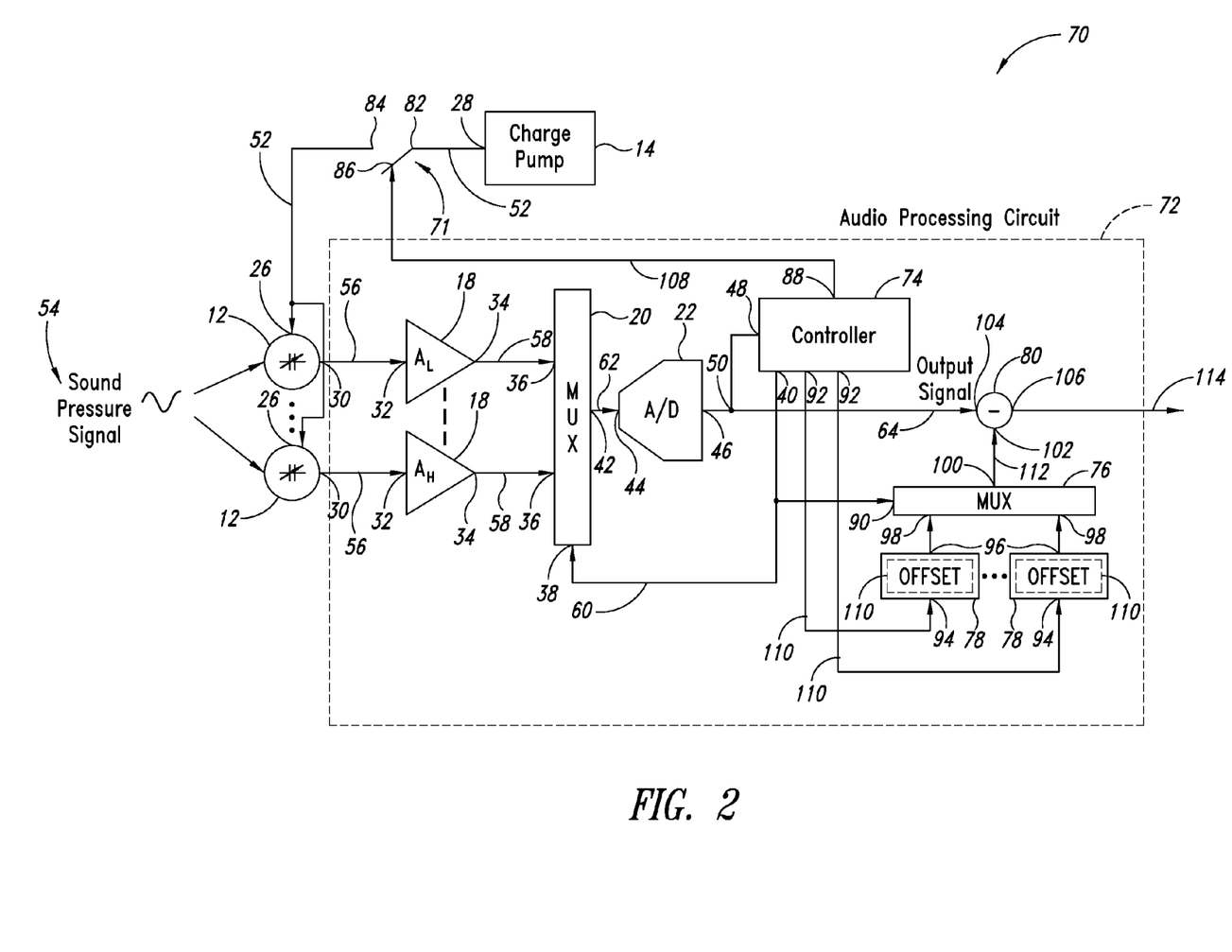
FIG. 2 shows a schematic of an offset calibration-equipped multi-membrane microphone.

FIG. 2 shows a schematic of an offset calibration equipped multi-membrane microphone 70. For convenience the offset calibration equipped multi-membrane microphone 70 is referred to hereinafter as the multi-membrane microphone 70 or the microphone 70.

The microphone 70 comprises the plurality of membranes 12, the charge pump 14, a charge pump switch 71 and an offset calibration equipped audio processing circuit 72 (referred to hereinafter as the audio processing circuit 72 for short). The audio processing circuit 72 comprises the plurality of amplifiers 18, the multiplexer 20, the A/D converter 22, an offset calibration equipped controller 74 (referred to hereinafter as the controller 74), an offset selection multiplexer 76, a plurality of registers 78 and an adder 80.

Each membrane 12 may be any type of sensing structure (for example, a microelectromechanical system (MEMS) sensing structure). In one embodiment, each membrane 12 is a capacitive acoustic transducer and may transduce acoustic pressure into an electrical signal using capacitive variation. The membrane 12 may have a fixed electrode and a mobile electrode. The mobile electrode may be formed by a diaphragm and arranged to face the fixed electrode, whereby the fixed electrode and the mobile electrode may form the plates of a sensing capacitor with variable capacitance. Examples of multi-membrane microphone are described in U.S. patent application Ser. Nos. 14/626,636 and 13/978,531, which are incorporated by reference herein.

The output port 28 of the charge pump is electrically coupled to a first port 82 of the charge pump switch 71, whereas a second port 84 of the charge pump switch 71 is electrically coupled to the plurality of input ports 26 of the respective plurality of membranes 12. A third port 86 (that is a control port) of the charge pump switch 71 is electrically coupled to a charge pump switch output port 88 of the controller 74. The charge pump switch 71 is thus operable to prevent the charging signal 52 from being provided to the plurality of input ports 26 of the respective plurality of membranes 12.

Further, the output port 30 of each membrane 12 is electrically coupled to an input port 32 of the respective amplifier 18 of the plurality of amplifiers 18. The output port 34 of each amplifier 18 of the plurality of amplifiers 18 is electrically coupled to the respective input port 36 of the plurality of input ports 36 of the multiplexer 20. Further, the selection signal input port 38 of the multiplexer 20 is electrically coupled to the selection signal output port 40 of the controller 74.

The output port 42 of the multiplexer 20 is electrically coupled to the input port 44 of the A/D converter 22, and the output port 46 of the A/D converter 22 is electrically coupled to the input port 48 of the controller 74 via the output node 50.

With respect to the controller 74, the selection signal output port 40 is coupled to a selection signal input port 90 of the offset selection multiplexer 76. Further, the controller 74 also has a plurality of offset output ports 92 that are respectively electrically coupled to a plurality of input ports 94 of the plurality of registers 78.

The plurality of registers 78 each have a respective output port 96 and the plurality of output ports 96 of the respective plurality of registers 78 are respectively electrically coupled to a plurality of input ports 98 of the offset selection multiplexer 76. An output port 100 of the offset selection multiplexer 76 is electrically coupled to a first input port 102 of the adder 80, whereas a second input port 104 of the adder 80 is electrically coupled to the output port 42 of the A/D converter 22. An output port 106 of the adder 80 is used for providing a digital audio output of the audio processing circuit 72.

The microphone 70 may be calibrated to compensate for the offsets of the plurality of amplifiers 18. Calibrating the microphone 70 may include measuring the respective offsets of the amplifiers 18, storing the offsets and then compensating, during operation, a selected amplifier output based on the respective measured offset of the plurality of offsets.

Each amplifier's 18 respective offset may be measured when the respective sensing signal 56 that is provided as the input to the amplifier 18 has a signal level of zero (i.e., no input signal is provided to the amplifier 18 for amplification). If not already disabled, the controller 24 disables outputting the sensing signal 56 at the output port 30 of the respective membrane 12 or inputting the sensing signal 56 to the input port 32 of the respective amplifier 18. To do so, the controller 74 outputs a charge pump switching signal 108 indicating that the charge pump switch 71 should be opened. For example, the charge pump switching signal 108 may be asserted to open the charge pump switch 71. In response to receiving the charge pump switching signal 108 at the third port 86, the charge pump switch 71 is opened. Thus, the first port 82 and the second port 84 of the charge pump switch 71 are disconnected and the charging signal output by the output port 28 of the charge pump 14 is no longer provided to the plurality of membranes 12. Without charge, the plurality of membranes 12 may not transduce the sound pressure signal 54 into the respective plurality of sensing signals 56.

Absent receiving the respective sensing signals 56, the respective amplified signals 58 output by the amplifiers 18 may have a signal level of zero. However, because each amplifier 18 is associated with an offset that the amplifier combines with its output signal, the respective amplified signal 58 that is output by the amplifier 18 may be a non-zero signal. During zero input conditions, the output signal level is the offset of the amplifier 18.

The controller 28 obtains a respective offset measurement 110 for each amplifier 18 of the plurality of amplifiers 18. Obtaining the offset measurement 110 for each amplifier 18 may be performed sequentially. The controller 28 outputs the selection signal 60 indicating selection of a respective amplified signal 58 of a selected amplifier 18 of the plurality of amplifiers 18. The multiplexer 20 outputs the selected amplified signal 62 as the respective amplified signal 58 of the selected amplifier 18. The A/D converter 22 receives the selected amplified signal 62 at its input port 44 and outputs, at its output port 46, the output signal 64 that is a digital representation of the selected amplified signal 62. Upon receiving the output signal 64 at its input port 48, the controller 24 may measure the offset of the selected amplifier as a DC value of the output signal 64 and thereby obtains the respective offset measurement 110 of the selected amplifier 18.

The controller 28 then stores the offset measurement 110. The controller 74 outputs the offset measurement 110 on a respective offset output port 92 of the plurality of offset output ports 92. A respective register 78 of the plurality of registers 78 receives the offset measurement 110 at its input port 94 and stores the offset measurement 110.

The controller 74 sequentially obtains the respective offset measurements 110 of the remaining amplifiers of the plurality of amplifiers 18 by repeating the technique described herein. The controller 74 stores the plurality of offset measurements 110 in the respective plurality of registers 78.

The controller 74 may put the microphone 70 in operation following obtaining or storing the plurality of offset measurements 110. To put the microphone in operation, the controller 74 activates the plurality of membranes 12 by outputting the charge pump switching signal 108 indicating that the charge pump switch 71 should be closed. The charge pump switch 71 receives the charge pump switching signal 108, and in response to the charge pump switching signal 108, the charge pump 71 transitions to the closed position, thereby causing the charging signal 52 to be provided at the respective input ports 26 of the membranes 12 and activating the membranes 12.

During operation the controller 74 may switch between input channels. The switching may be based on the signal level of the sound pressure signal 54. The controller 74 switches between channels by outputting the selection signal 60 indicating selection of a different one of the plurality of amplified signals 58 corresponding to a respective one of the plurality of membranes 12 for processing. The selection signal 60 is received at the selection signal input port 90 of the offset selection multiplexer 76. In response to receiving the selection signal 60, the offset selection multiplexer 76 outputs the selected offset measurement 112 at the output port 100. The selected offset measurement 112 is received by the first input port 102 of the adder 80. The adder 80 compensates the output signal 64 received at its second input port 104 by subtracting the selected offset measurement 112 from the output signal 64 and outputs a compensated signal 114 at its output port 106.

If the controller 74 switches to another membrane 12, the offset measurement 110 by which the output signal 64 is compensated changes. Accordingly, regardless of the channel used the output signal 64 is compensated by the appropriate offset measurement 110.

In the microphone 70 described with reference to FIG. 2, inputting of the sensing signals 56 to the respective amplifiers 18 is disabled by not providing the charging signals 52 to the plurality of membranes 12. However, alternatively, inputting of the plurality of sensing signals 56 to the amplifiers 18 may be disabled by grounding the respective input ports 32 of the amplifiers 18.

Figure 3:
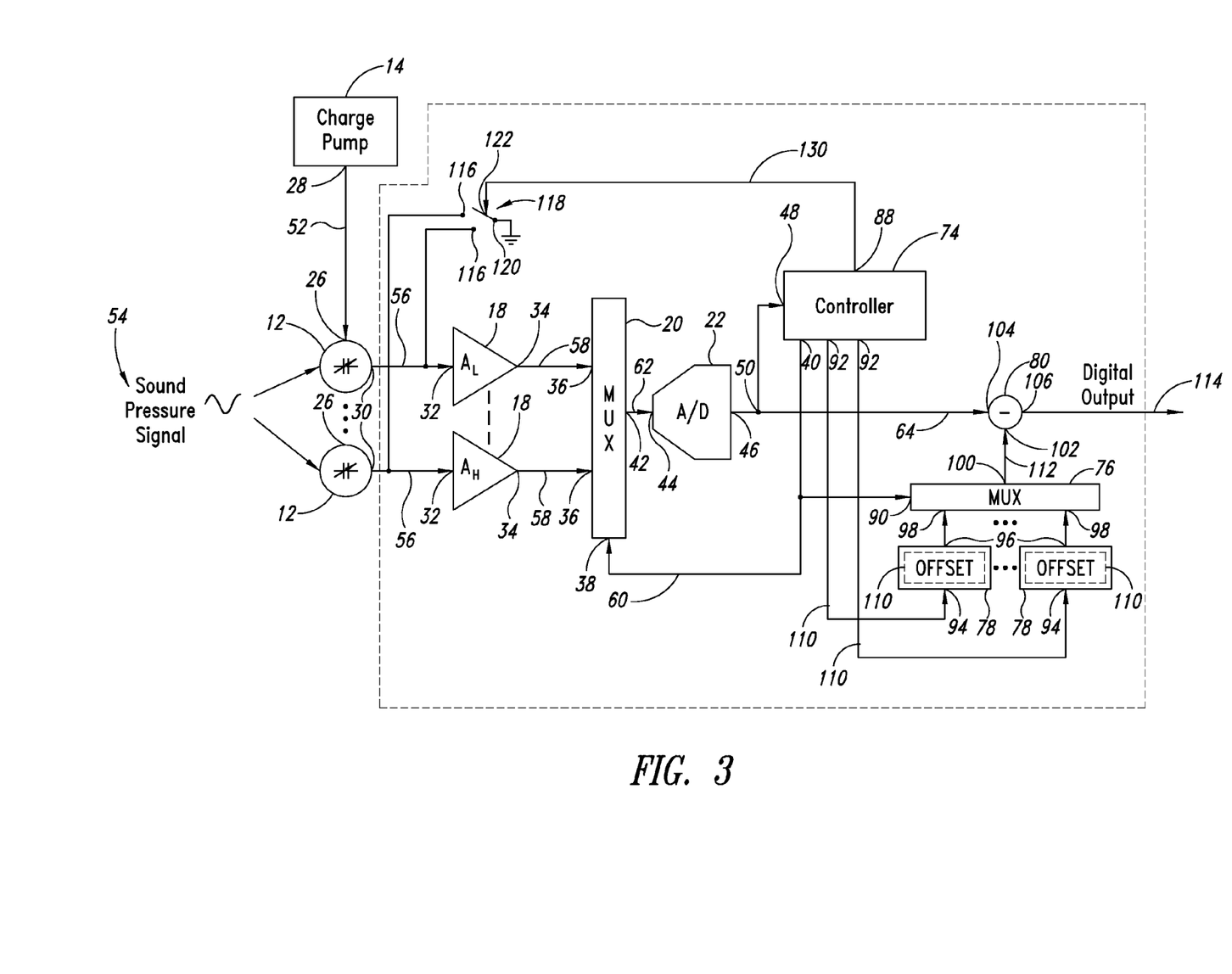
FIG. 3 shows a schematic of an offset calibration-equipped multi-membrane microphone in accordance with at least one embodiment.

FIG. 3 shows a schematic of an offset calibration equipped multi-membrane microphone 70 in accordance with at least one embodiment. Similar elements of the microphone 70 described with reference to FIG. 3 as those of the membrane microphone 70 described with reference to FIG. 2 have the same reference numerals and in some circumstances are not described hereinafter.

In addition to being coupled to the respective output ports 30 of the membranes 12, the respective input ports 32 of the amplifiers 18 are electrically coupled to respective anodes of 116 of a grounding switch 118. A cathode 120 of the grounding switch 118 is electrically coupled to ground. Further, a switching port 122 of the grounding switch 118 is electrically coupled to a switching output port 124 of the controller 74.

Input to the plurality of amplifiers 18 may be disabled when the grounding switch 118 is closed. When the grounding switch 118 is closed, the respective input nodes 34 of the amplifiers 18 are connected to ground and no input signal is provided to the amplifiers. If the grounding switch 118 is not already closed, the controller 74 outputs a signal 130 indicating that the grounding switch 118 is to be closed. The controller 74 may then obtain the respective offset measurements 110 of the amplifiers 18 as described herein. Following obtaining the plurality of offset measurements 110, the microphone 70 may be put into operational or audio sensing mode. To put the microphone 70 in this mode, the controller 74 outputs the signal 130 indicating that the grounding switch 118 is to be opened. In response to the signal 130, the grounding switch 118 transitions to the open position. When the grounding switch 118 is in the open position, the respective sensing signals 56 to the amplifiers 18 are received at the respective input nodes 32. As described herein, the controller 74 may switch between membranes 12 depending on the signal level of the impinging sound pressure signal 54.

Figure 4:
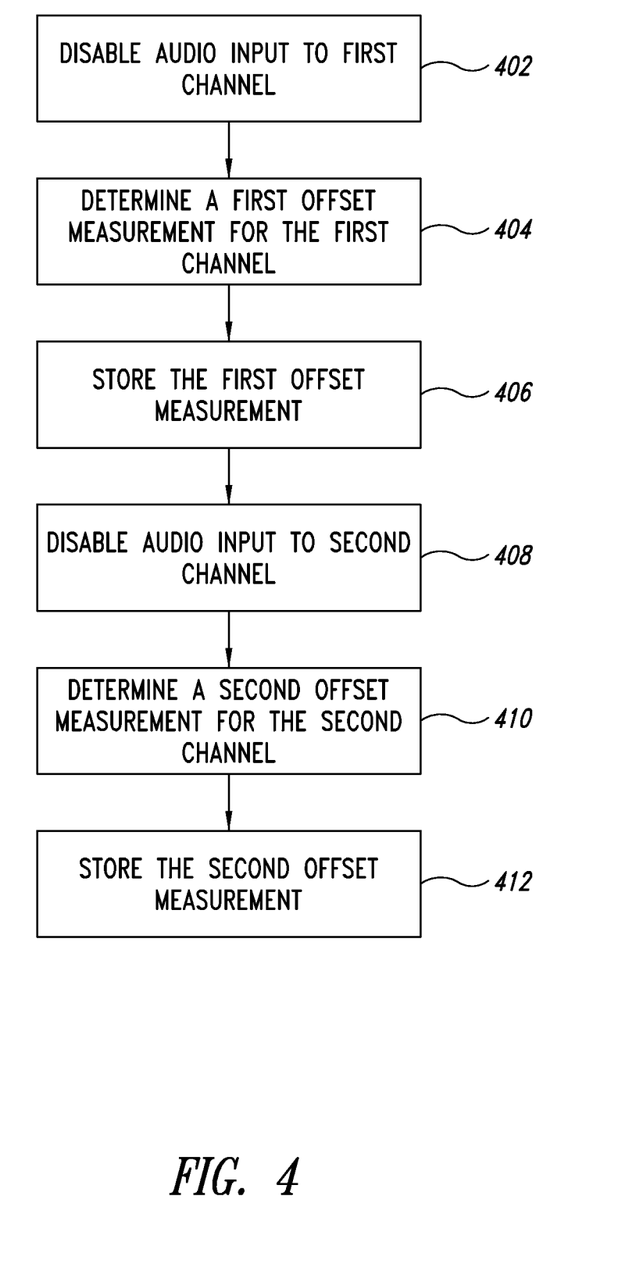
FIG. 4 shows a method for obtaining the plurality of offset measurements in accordance with at least one embodiment.

FIG. 4 shows a method for obtaining the plurality of offset measurements in accordance with at least one embodiment. The controller 74, at step 402, disables audio input to a first channel. As described herein, disabling the audio input may include grounding the input to the amplifier 18 associated with the channel or disconnecting the charging signal 52 from the membrane 12 associated with the channel. A channel (for example, audio channel) may include a plurality of devices (such as one membrane 12 and one amplifier 18) serially electrically coupled. The channel may be used for processing the sound pressure signal 54 detected by the one membrane 12. The channel may include other devices used for processing the sound pressure signal 54, such as the multiplexer 20 and the A/D converter 22. Some device pertaining to one channel may be used for processing audio of other channels.

The controller 74, at step 404, determines a first offset measurement for the first channel and, at step 406, stores the first offset measurement. The controller 74 then, at step 408, disables audio input to a second channel. The controller 74, at step 410, determines a second offset measurement for the second channel and, at step 412, stores the second offset measurement. The first and second offset measurements may be stored by the controller in the registers 78. In the event that there are more than two channels, the steps 408-412 may be repeated for each of the other channels.

Figure 5:
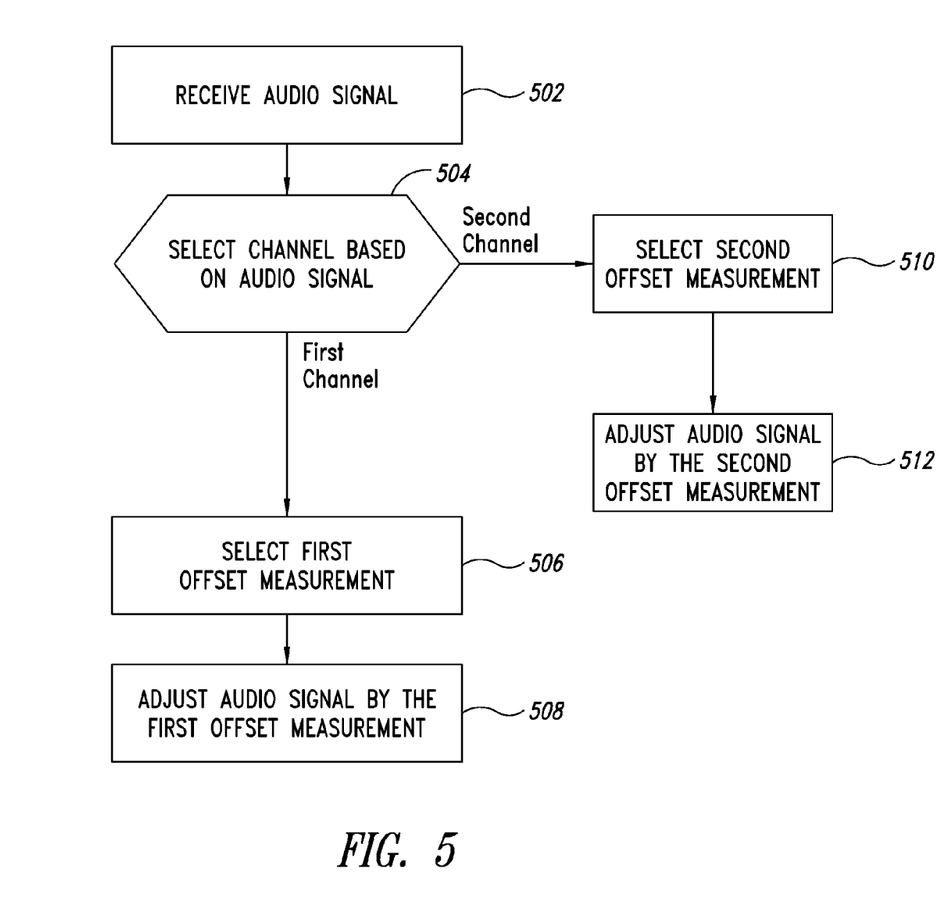
FIG. 5 shows a method for calibrating a microphone in accordance with at least one embodiment.

FIG. 5 shows a method for calibrating a microphone 70 in accordance with at least one embodiment. In the method, at step 502 the controller 74 receives an audio signal and, at step 504, selects a channel based on the audio signal. If the first channel is selected, the controller 74, at step 506, selects a first offset measurement corresponding to the first channel and, at step 508, adjusts the audio signal by the first offset measurement. If, on the other hand, the second channel is selected, the controller 74, at step 510, selects a second offset measurement and, at step 512, adjusts the audio signal by the second offset measurement.

Figure 6:
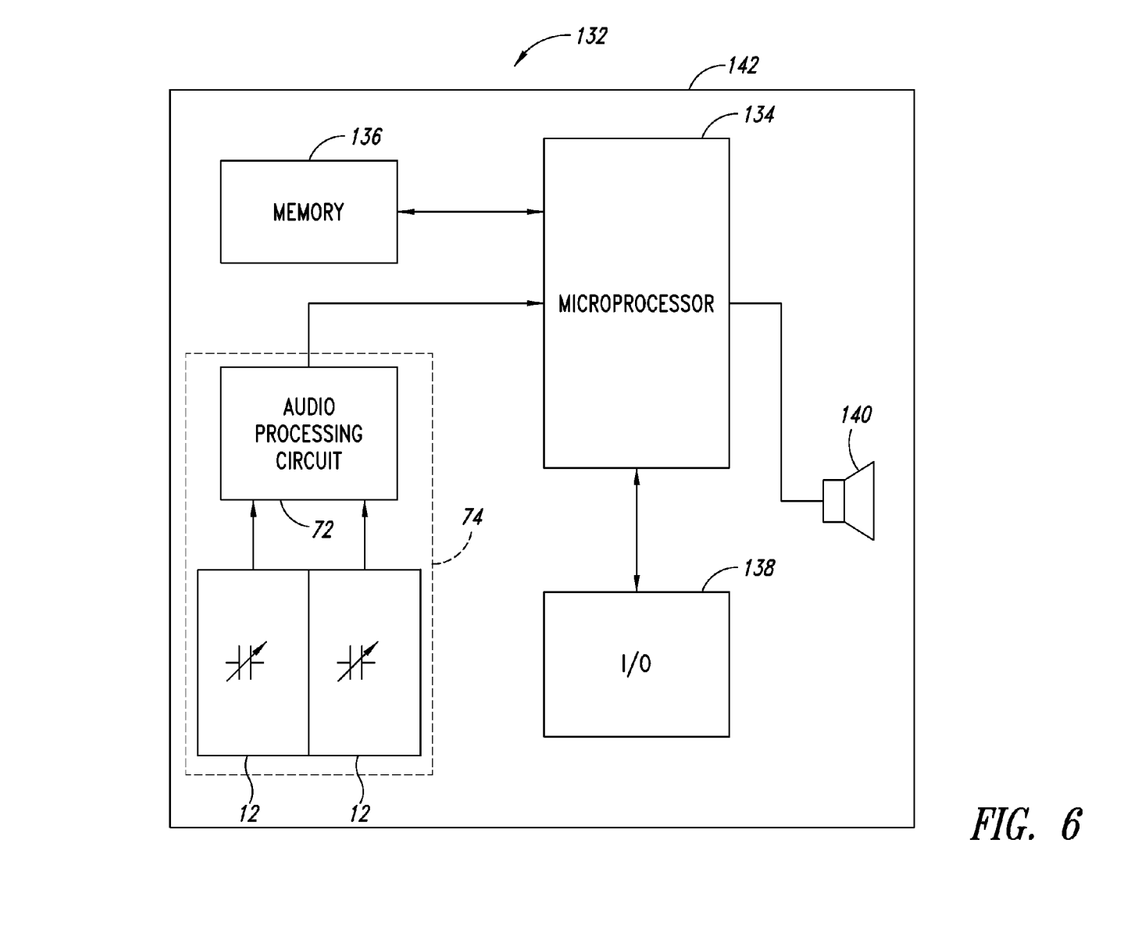
FIG. 6 shows as schematic of implementation of the microphone in an electronic device.

FIG. 6 shows as schematic of implementation of the microphone 70 in an electronic device 132. The electronic device 132 may, for example, be a mobile communication device, such as a smartphone, tablet, laptop, or voice recorder, among others. Furthermore, the electronic device 132 may be a hydrophone operable underwater or a hearing-aid device.

The electronic device 132 comprises a microprocessor 134, a device memory 136, connected to the microprocessor 134, and an input/output interface 138, which is for example formed by a keypad and a screen and is also connected to the microprocessor 134. The microphone 70 communicates with the microprocessor 134; in particular, the audio processing circuit 72 sends the compensated signal 114 to the microprocessor 132 possibly after further processing.

The electronic device 132 further comprises a speaker 140, which is connected to the microprocessor 134 and is designed to generate a sound based on an audio output of the electronic device 132. In addition, the digital microphone 74, the microprocessor 134, the device memory 136, the input/output interface 138, and the speaker 140 are mounted, for example, on a single printed circuit board (PCB) 142, for instance with a surface-mount technique.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multi-membrane microphone, comprising:
   a plurality of membranes configured to be activated when the multi-membrane microphone is in operation, the plurality of membranes being configured to output a plurality of sensing signals, respectively, in response to sound;
   a plurality of amplifiers respectively having a plurality of input ports respectively electrically coupled to the plurality of membranes, the plurality of amplifiers respectively corresponding to the plurality of sensing signals, each amplifier of the plurality of amplifiers being configured to receive the corresponding sensing signal and create a corresponding amplified signal of a plurality of amplified signals by amplifying the corresponding sensing signal, the plurality of amplifiers being configured to introduce a plurality of offsets into the amplified signals, respectively;
   a multiplexer configured to receive the plurality of amplified signals and a selection signal indicating selection of a selected amplified signal of the plurality of amplified signals and output the selected amplified signal in response to receiving the selection signal; and
   a controller electrically coupled to the multiplexer and configured to:
      sequentially measure the offset for each amplifier of the plurality of amplifiers while the membrane is inactive and store the offset; and
      compensate each amplified signal by the corresponding offset during operation of the multi-membrane microphone.

2. The multi-membrane microphone of claim 1, further comprising:
   a charge pump electrically coupled to the plurality of membranes and the controller and configured to receive an activation command from the controller and activate or deactivate the plurality of membranes based on the activation command.

3. The multi-membrane microphone of claim 1 wherein the amplifiers are configured to introduce the respective offsets into the respective amplified signals by respectively additively combining the respective offsets into the respective amplified signals.

4. The multi-membrane microphone of claim 1 wherein the controller is further configured to:
   detect that the multi-membrane microphone is turned on or existed sleep mode and, in response to the detecting, sequentially measure the offset for each amplifier.

5. The multi-membrane microphone of claim 1, further comprising:
   a plurality of registers electrically coupled to the controller, the plurality of registers being configured to receive the plurality of offsets from the controller and respectively store the offsets.

6. The multi-membrane microphone of claim 5, further comprising:
   an analog-to-digital (A/D) converter electrically coupled to the multiplexer and the controller, the A/D converter being configured to receive the selected amplified signal from the multiplexer, convert the selected amplified signal from an analog signal to a digital signal and output the selected amplified signal as the digital signal to the controller.

7. The multi-membrane microphone of claim 6, further comprising:
an offset selection multiplexer electrically coupled to the controller and the plurality of registers, the offset selection multiplexer configured to receive an offset selection signal from the controller indicating a selected offset of the plurality of offsets and output a corresponding selected offset stored in a respective register; and
an adder electrically coupled to the offset selection multiplexer and the A/D converter, the adder being configured to receive the selected offset from the offset selection multiplexer and the selected amplified signal from the A/D converter, reduce a signal level of the selected amplified signal by the selected offset to generate an output signal, and output the output signal.

8. The multi-membrane microphone of claim 7 wherein the controller is configured to compensate each amplified signal by outputting the offset selection signal to the offset selection multiplexer.

9. The multi-membrane microphone of claim 1, further comprising:
a grounding switch having a cathode electrically coupled to ground, a plurality of anodes respectively electrically coupled to the plurality of input ports of the plurality of amplifiers and a switching port electrically coupled to the controller wherein:
the grounding switch is configured to receive, at the switching port, a signal from the controller indicating that the grounding switch is to be closed or opened, and the grounding switch is configured to be placed in a closed position or an opened position in response to the signal.

10. The multi-membrane microphone of claim 9 wherein the controller is configured to deactivate the plurality of membranes by outputting the signal indicating that the grounding switch is to be closed.

11. A method, comprising:
obtaining, by a controller, a plurality of offsets corresponding to a plurality of channels, respectively, of a microphone, the obtaining including, for each channel:
detecting, by the controller, a signal level on the channel while audio input to the channel is not enabled; and
determining, by the controller, the offset of the channel based on the detected signal level on the channel while the channel is not enabled;
storing the plurality of offsets;
enabling audio input to a selected channel of the channels; and
processing the audio input by adjusting the audio input by the corresponding offset stored for the channel.

12. The method of claim 11 wherein determining the offset of the channel further includes determining the offset as a DC value representing the detected signal level on the channel while the channel is not enabled.

13. The method of claim 11, further comprising:
disabling the channel prior to determining the offset of the channel.

14. The method of claim 11, further comprising:
converting, by an analog-to-digital converter, the audio input from analog to digital prior to processing the audio input.

15. An audio processing circuit for a multi-channel microphone, the processing circuit comprising:
a plurality of amplifiers configured to respectively receive a plurality of sensing signals and create a corresponding plurality of amplified signals by amplifying the respective plurality of sensing signals, the plurality of amplifiers being configured to introduce a plurality of offsets into the amplified signals, respectively;
a multiplexer configured to receive the plurality of amplified signals and a selection signal indicating selection of a selected amplified signal of the plurality of amplified signals and output the selected amplified signal in response to receiving the selection signal; and
a controller electrically coupled to the multiplexer and configured to:
sequentially measure the offset for each amplifier of the plurality of amplifiers while the membrane is inactive and store the offset; and
compensate each amplified signal by the corresponding offset during operation of the multi-membrane microphone.

16. The audio processing circuit of claim 15, further comprising:
a plurality of membranes electrically coupled to the plurality of amplifiers, respectively, and configured to be individually activated when the multi-membrane microphone is in operation.

17. The audio processing circuit of claim 16, further comprising:
a charge pump electrically coupled to the plurality of membranes and the controller and configured to receive an activation command from the controller and activate or deactivate the plurality of membranes based on the activation command.

18. The audio processing circuit of claim 15, further comprising:
a plurality of registers configured to store a respective plurality of offsets of the plurality of amplifiers;
an offset selection multiplexer electrically coupled to the controller and the plurality of registers, the offset selection multiplexer configured to receive an offset selection signal from the controller indicating a selected offset of the plurality of offsets and output a corresponding selected offset stored in a respective register; and
an analog-to-digital (A/D) converter electrically coupled to the multiplexer and the controller, the A/D converter being configured to receive the selected amplified signal from the multiplexer, convert the selected amplified signal from an analog signal to a digital signal and output the selected amplified signal as the digital signal to the controller; and
an adder electrically coupled to the offset selection multiplexer and the A/D converter, the adder being configured to receive the selected offset from the offset selection multiplexer and the selected amplified signal from the A/D converter, reduce a signal level of the selected amplified signal by the selected offset to generate an output signal, and output the output signal.

19. A system, comprising:
a microprocessor;
a multi-membrane microphone electrically coupled to the microprocessor, the multi-membrane microphone comprising:
a plurality of membranes configured to be activated when the multi-membrane microphone is in operation, the plurality of membranes being configured to output a plurality of sensing signals, respectively, in response to sound; and an audio processing circuit comprising:
- a plurality of amplifiers respectively electrically coupled to the plurality of membranes and respectively corresponding to the plurality of sensing signals, each amplifier of the plurality of amplifiers being configured to receive the corresponding sensing signal and create a corresponding amplified signal of a plurality of amplified signals by amplifying the corresponding sensing signal, the plurality of amplifiers being configured to introduce a plurality of offsets into the amplified signals, respectively;
- a multiplexer configured to receive the plurality of amplified signals and a selection signal indicating selection of a selected amplified signal of the plurality of amplified signals and output the selected amplified signal in response to receiving the selection signal; and
- a controller electrically coupled to the multiplexer and configured to:
  - sequentially measure the offset for each amplifier of the plurality of amplifiers while the membrane is inactive and store the offset; and
  - compensate each amplified signal by the corresponding offset during operation of the multi-membrane microphone.

20. The system of claim 19 wherein the controller is further configured to:
  detect that the multi-membrane microphone was turned on or existed sleep mode and, in response to the detecting, sequentially measure the offset for each amplifier.

* * * * *